(12) United States Patent
Lin et al.

(10) Patent No.: US 7,131,188 B2
(45) Date of Patent: Nov. 7, 2006

(54) PROCESS FOR IMPLEMENTING CONDUCTIVE TRACING LAYOUT IN TOUCH PANEL

(75) Inventors: Hong-Yu Lin, Hsinchu (TW); Yi-Hung Tsai, Hsinchu (TW)

(73) Assignee: TPO Displays Corp., Chu-Nan (TW)

( * ) Notice: Subject to any disclaimer, the term of this patent is extended or adjusted under 35 U.S.C. 154(b) by 382 days.

(21) Appl. No.: 10/465,088

(22) Filed: Jun. 19, 2003

(65) Prior Publication Data

US 2004/0041795 A1    Mar. 4, 2004

(51) Int. Cl.
- H01H 11/00 (2006.01)
- H01H 11/02 (2006.01)
- H01H 11/04 (2006.01)
- H01H 65/00 (2006.01)

(52) U.S. Cl. ............ 29/622; 29/825; 29/829; 29/846; 29/849; 29/887; 174/260; 174/264; 345/173; 428/209

(58) Field of Classification Search ......... 29/622, 29/825, 829, 846, 849, 887; 174/260, 264; 345/173; 428/209

See application file for complete search history.

(56) References Cited

U.S. PATENT DOCUMENTS 6,326,561 B1 * 12/2001 Watanabe et al. ........... 174/264
6,555,209 B1 *  4/2003 Yoshimura et al. ......... 428/209

FOREIGN PATENT DOCUMENTS

JP    60-222918    11/1985
JP    09-26852     1/1997

* cited by examiner

Primary Examiner—A. Dexter Tugbang
Assistant Examiner—Tim Phan

(57) ABSTRACT

The touch panel comprises two conductive substrates arranged in parallel and secured to each other with a gap existing between the conductive substrates The process for implementing a conductive tracing layout in a touch panel includes steps of forming a first conductive layer on at least one of the conductive substrates; forming a first photo-resist layer on the first conductive layer; removing a specified portion of the first photo-resist layer to form a first specified mask on a specified portion of the first conductive layer; and removing the first conductive layer except the specified portion of the first conductive layer to form a first conductive tracing layout.

6 Claims, 5 Drawing Sheets

PROCESS FOR IMPLEMENTING CONDUCTIVE TRACING LAYOUT IN TOUCH PANEL

CROSS REFERENCE TO RELATED DOCUMENT

This application claims priority to Taiwanese Patent Applications No. 091101770, filed on Feb. 01, 2002.

FIELD OF THE INVENTION

The present invention relates to a process for implementing a conductive tracing layout, and more particularly to a process for implementing a conductive tracing layout which is applied to a touch panel.

BACKGROUND OF THE INVENTION

A cathode ray tube (CRT) monitor has been gradually replaced by a liquid crystal display (LCD) due to the disadvantages of heavy weight, bulky size, and electromagnetic radiation. So far, an LCD has been extensively applied in various information products and communication products such as a notebook PC, mobile phone, portable PC, personal digital assistant (PDA), and so on. The interface of an information product or a communication product provided for a user to input data, for example, could be a touch panel or touch screen, which is attached on the screen of LCD. Then, the input data is measured by detecting the touch point.

A touch pannel is typically produced by aligning and securely combining an upper substrate and a lower substrate, both of which have good electrical conductivity before being attached onto the LCD panel. The upper substrate and the lower substrate are arranged in parallel and secured to each other with a gap existing therebetween. In other words, the upper substrate does not contact with lower substrate directly, and the gap is kept by providing a set of non-conductive spacer dots glued to and clamped between the upper substrate and the lower substrate. The structure of a touch panel could be one of a "film to film" structure (i.e., the upper substrate and the lower substrate are both conductive films, for example indium-tin oxide (ITO) films), a "film to glass" structure (i.e., the upper substrate and the lower substrate include a conductive film and a conductive glass, for example an ITO film and an ITO glass) and a "glass to glass" structure (i.e., the upper substrate and the lower substrate are both conductive glasses, for example ITO glasses).

Currently, the conductive tracing layout in the touch panel is implemented by printing conductive paste, for example silver paste, on the upper substrate and the lower substrate. Various touch panels have been disclosed in prior art such as Japanese Patent No. JP9026852 entitled "Touch Panel", and Japanese Patent No. JP60222918 entitled "Manufacture of Touch Type Input Device", which are incorporated herein for reference.

Please refer to FIG. 1A and FIG. 1B for more details about the conductive tracing layout on the upper substrate and the lower substrate off the touch panel. In FIG. 1A, an example of the conductive tracing layout required by a conventional touch panel is shown. The conventional touch panel 10 mainly includes three areas: an active region 10a, a transparent region 10b and a tracing layout region 10c. The active region 10a is the one where the touch point by an external force can be sensed. The transparent region 10b is of a loop configuration surrounding the active region 10a, and is light-transmissible. The transparent region, on the other hand, has no touch detection function. With regard to tracing layout region 10c, it is also of a loop configuration surrounding the transparent region 10b for providing therein tracing layout required by the touch panel 10. Furthermore, please refer to FIG. 1A, there are four conductive traces 12 disposed on the touch panel 10 and connected to four conductive buses 14 outside the touch panel 10, respectively, which are isolated from one another.

The whole tracing layout shown in FIG. 1A is implemented by separately forming respective portions on the upper and lower substrates, and then gluing the upper and the lower substrates to combine the portions together. FIGS. 1B and 1C schematically show the portions of conductive tracing layout distributed on the upper substrate 20 and the lower substrate 30 of the conventional touch panel, respectively, in other words, while a part of conductive traces 12 are formed on the upper substrate 20, as shown in FIG. 1B, the other part of the conductive traces 12 are formed on the lower substrate 30. By combining the upper substrate 20 and the lower substrate 30 together in parallel, the two portions of conductive traces 12 are combined as the conductive tracing layout shown in FIG. 1A.

Since the above-mentioned conductive tracing layout on the touch panel is achieved in a printing manner that conductive paste is formed on the upper substrate and the lower substrate, there are likely to be some disadvantages as described as follow: (1) relatively large trace width, e.g. larger than 0.5 mm, is required; (2) relatively large line-to-line space, e.g. wider than 0.7 mm, is required due to possible signal loss during signal transmission; and (3) it is hard to narrow down the margins of touch panel, i.e. the distance between the inner and outer edges of the tracing layout region 10C, due to the consideration of adhesion capability of the conductive paste. Generally, the margin of the touch panel is even up to 5.4 mm. Therefore, how to solve these problems will be very important for improving the property of the touch panel.

SUMMARY OF THE INVENTION

An object of the present invention is to provide a process for implementing conductive tracing layout in a touch panel, in order to narrow down the tracing width.

Another object of the present invention is to provide a process for implementing conductive tracing layout in a touch panel, able to reduce signal loss during the signal transmission so as to allow the shortening of the line-to-line space between every two conductive traces.

A further object of the present invention is to provide a process for implementing conductive tracing layout in a touch panel, in order to narrow down the margins of the conductive tracing layout region.

A first aspect of the present invention relates to a process for implementing a conductive tracing layout in a touch panel. The touch panel comprises two conductive substrates arranged in parallel and secured to each other with a gap existing between the conductive substrates. The process comprises steps of forming a first conductive layer on at least one of the conductive substrates; forming a first photo-resist layer on the first conductive layer; removing a specified portion of the first photo-resist layer to form a first specified mask on a specified portion of the first conductive layer; and removing the first conductive layer except the specified portion of the first conductive layer to form a first conductive tracing layout.

Preferably, the conductive substrate is coated with an ITO material, and the first conductive layer is made of silver.

The gap between the two conductive substrates, for example, can be provided by providing non-conductive spacer dots between the conductive substrates.

Preferably, the first conductive layer is formed by Physical Vapor Deposition (PVD) or Chemical Vapor Deposition (CVD).

Generally, the process further comprises a step of removing the residual portion of the first photo-resist layer.

In an embodiment, the process further comprises steps of forming a dielectric layer on the first conductive tracing layout; removing a specified portion of the dielectric layer according to the first conductive tracing layout; forming a second conductive layer over the dielectric layer; forming a second photo-resist layer on the second conductive layer; removing a specified portion of the second photo-resist layer to form a second specified mask on the second conductive layer; and removing the second conductive layer except the specified portion of the second conductive layer to form a second conductive tracing layout.

Generally, the process further comprises a step of removing the residual portion of the second photo-resist layer.

Preferably, the second conductive layer is made of silver. The dielectric layer is made of oxide or nitride. The dielectric layer and the second conductive layer are both formed by Physical Vapor Deposition (PVD) or Chemical Vapor Deposition (CVD).

According to a second aspect of the present invention, the process for implementing a conductive tracing layout in a touch panel comprises steps of: forming a first conductive layer on at least one of the conductive substrates; forming a first photo-resist layer on the first conductive layer; removing a specified portion of the first photo-resist layer to form a first specified mask on a specified portion of the first conductive layer; removing the first conductive layer except the specified portion of the first conductive layer to form a first conductive tracing layout; removing the residual portion of the first photo-resist layer; forming a dielectric layer on the first conductive tracing layout; removing a specified portion of the dielectric layer according to the first conductive tracing layout; forming a second conductive layer over the dielectric layer; forming a second photo-resist layer on the second conductive layer; removing a specified portion of the second photo-resist layer to form a second specified mask on the second conductive layer; removing the second conductive layer except the specified portion of the second conductive layer to form a second conductive tracing layout; and removing the residual portion of the second photo-resist layer.

BRIEF DESCRIPTION OF THE DRAWINGS

The present invention may best be understood through the following description with reference to the accompanying drawings, in which.

DETAILED DESCRIPTION OF THE INVENTION

The present invention is related to a process for implementing conductive tracing layout in a touch panel, wherein the touch panel comprises two conductive substrates combined in parallel, and a gap between the conductive substrates. The gap is created by adhering spacer dots between the two conductive substrates. The conductive tracing is implemented on the opposite surfaces of two conductive substrates. According to the present invention, a conductive material is formed on the two conductive substrates by a deposition process such as Physical Vapor Deposition (PVD) or Chemical Vapor Deposition (CVD). Then, a precise conductive tracing layout can be produced on the two conductive substrates by way of the micro-lithographic technology. By the present process, the width of each of the conductive traces can be reduced to less than 0.1 mm. Besides, the signal loss during the signal transmission via the conductive traces can be minimized. The line-to-line space between every two conductive traces can thus be reduced to less than 0.1 mm.

According to a first embodiment of the present invention, the detailed description of the process for implementing conductive tracing layout will be described hereinafter.

Figure 1A:
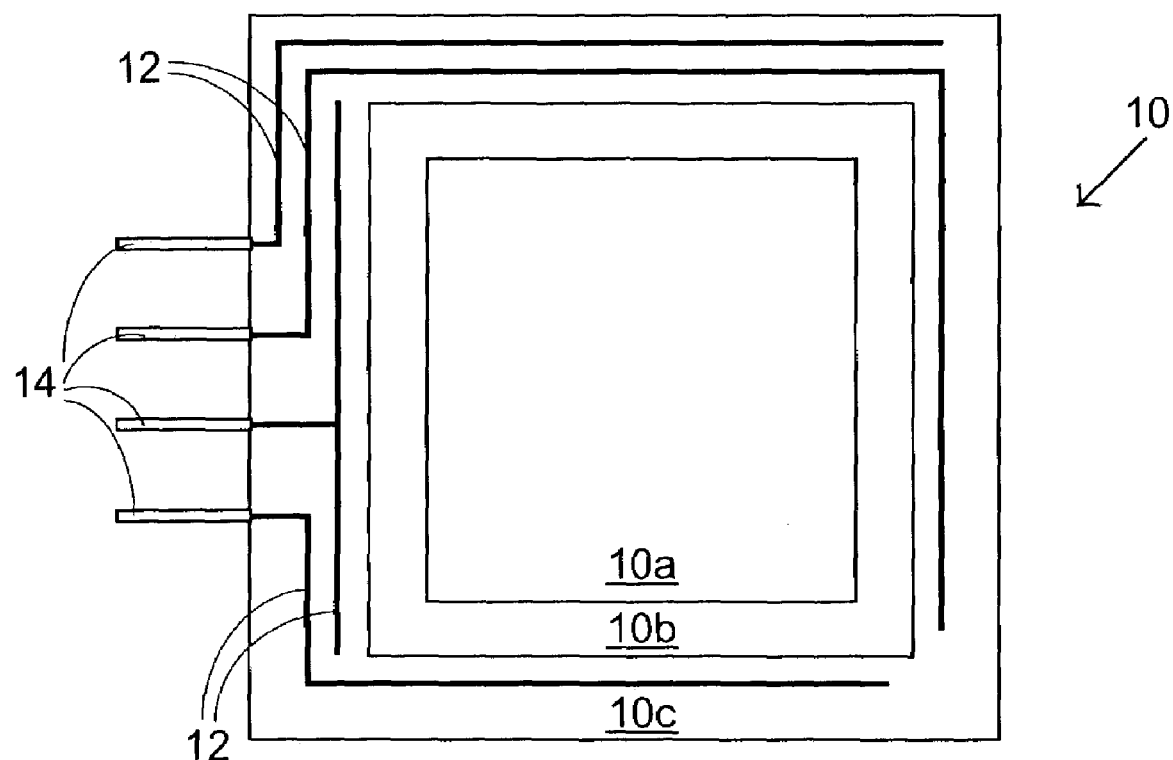
FIG. 1A is a schematic diagram showing an exemplified conductive tracing layout in a conventional touch panel.
Figure 1B:
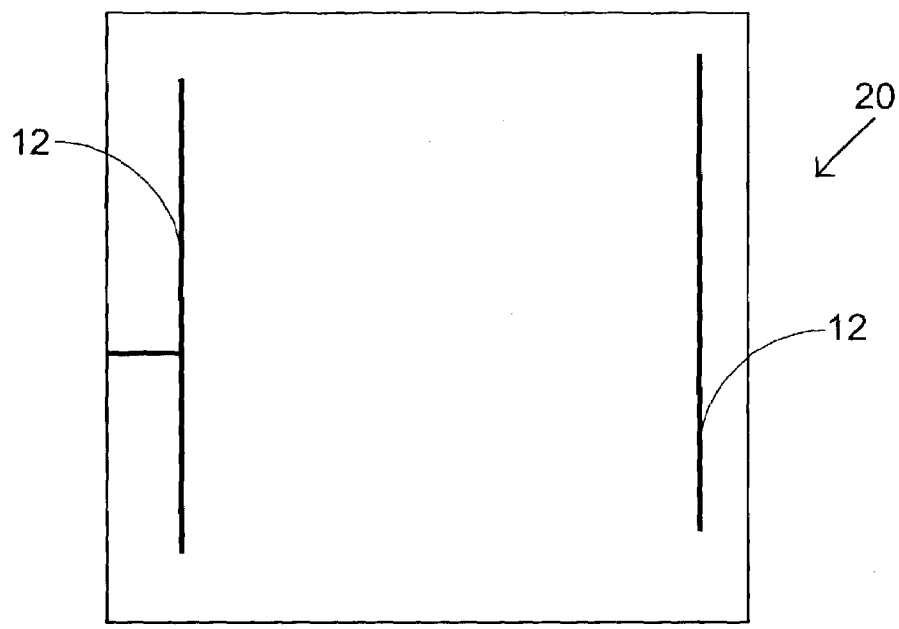
FIG. 1B is a schematic diagram showing the formation of a part of the conductive tracing layout of FIG. 1A on an upper substrate of the conventional touch panel.
Figure 1C:
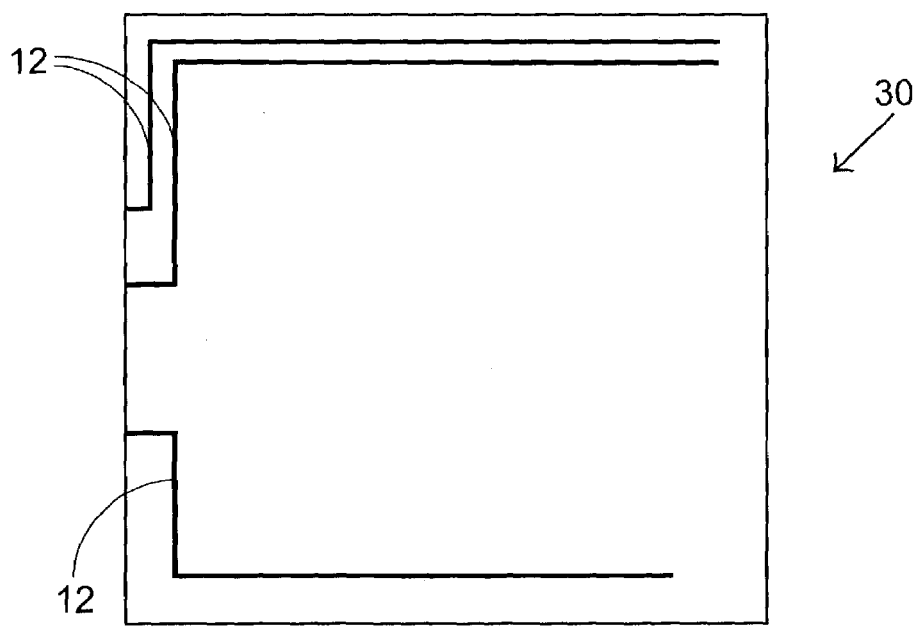
FIG. 1C is a schematic diagram showing the formation of the other part of the conductive tracing layout of FIG. 1A on a lower substrate of the conventional touch panel.
Figure 2A:
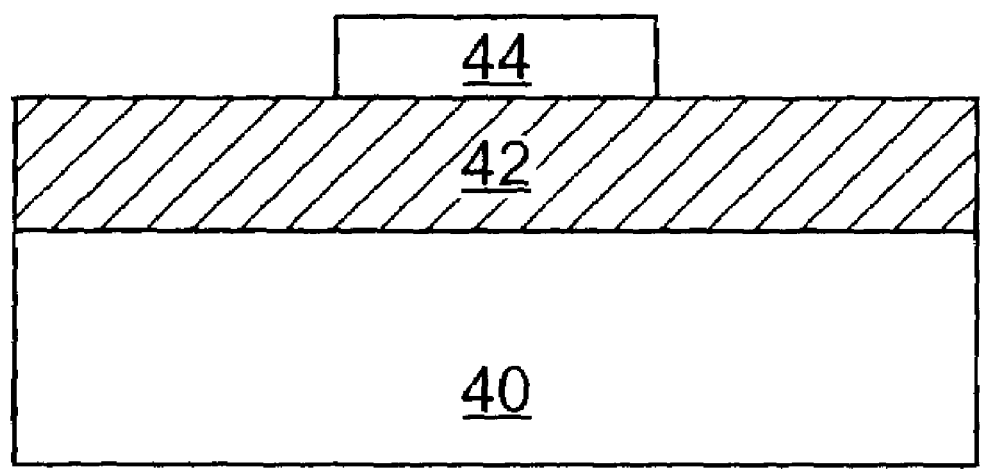
FIGS. 2A and 2B are schematic diagrams showing the steps of implementing a mono-layer conductive tracing layout according to a first embodiment of the present invention.
Figure 2B:
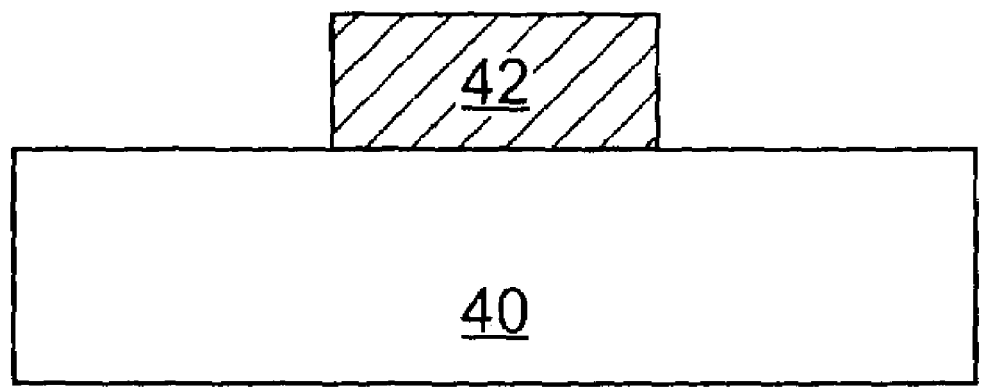

At first, a first conductive layer 42 and a first photo-resist layer 44 are formed on a conductive substrate 40, and then a part of the first photo-resist layer 44 is removed according to a defined pattern, as shown in FIG. 2A. Using the patterned first photo-resistive layer 44 as a mask, a part of the first conductive layer 42 is removed, so as to expose conductive substrate at the un-masked regions. Thereafter, the residual first photo-resistive layer 44 is removed completely. A mono-layer conductive tracing layout is thus formed on the conductive substrate 40, as shown in FIG. 2B.

According to the first embodiment of the present invention, a mono-layer conductive tracing layout is provided. That is, the conductive tracing layout is formed on the conductive substrate. On the other hand, a multi-layer conductive tracing layout requires the traces are distributed on a plurality of planes in parallel to the conductive substrate. By providing a dielectric layer between every two adjacent conductive layers, the traces can be vertically overlapped with one another. That will facilitate to narrow down the margin of the touch panel. The width between the inner and outer edges of the tracing layout region can be reduced down to 1.6 mm.

Figure 3A:
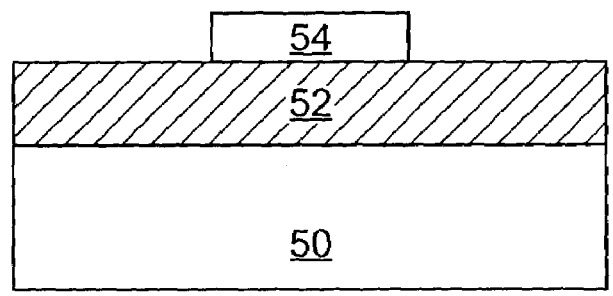
FIGS. 3A~3E are schematic diagrams showing the steps of implementing a dual-layer conductive tracing layout according to a second embodiment of this invention.
Figure 3B:
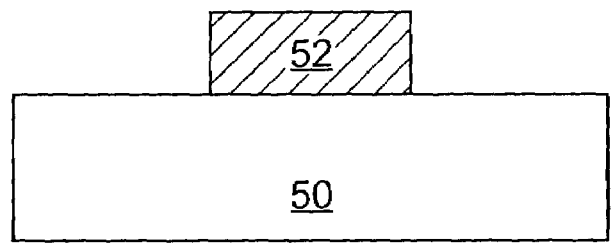

The second preferred embodiment which is about a dual-layer conductive tracing layout of this invention is stated as follow with reference to FIGS. 3A~3E. At first, a first conductive layer 52 and a first photo-resist layer 54 are formed on a conductive substrate 50 in sequence, and then the first photo-resist layer 54 is removed partially according to a predetermined pattern, as shown in FIG. 3A. Then, the unmasked portions of the conductive layer 52 are etched off and the residual photo-resist mask 54 is removed, as shown in FIG. 3B. Accordingly, a first layer of a conductive tracing layout is defined on the first conductive layer 52.

Figure 3C:
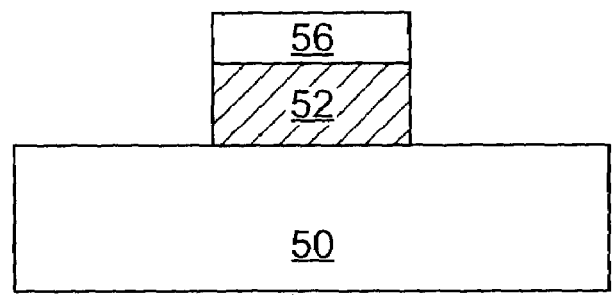
Figure 3D:
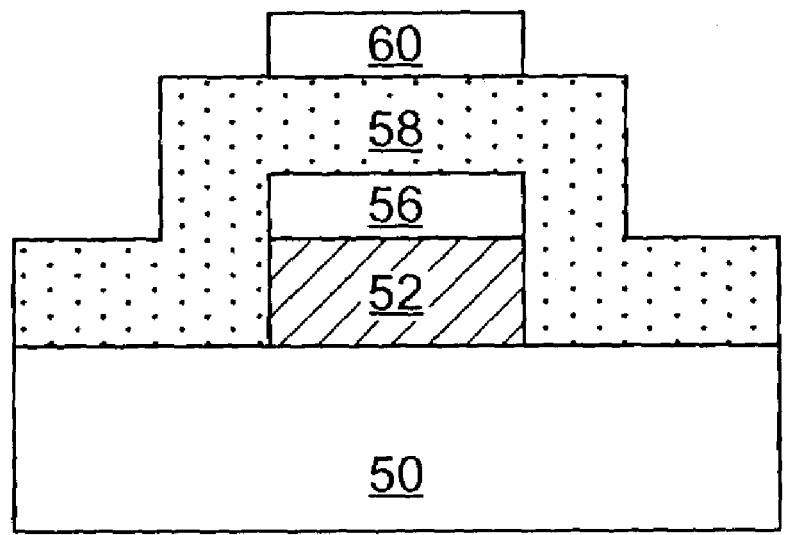
Figure 3E:
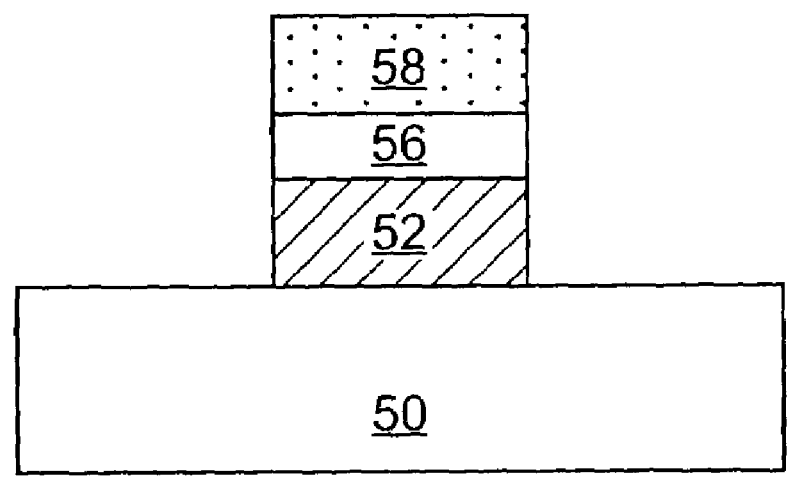

Further, referring to FIG. 3C, a dielectric layer 56 is formed over the conductive substrate 50 and the patterned conductive layer 52. The dielectric layer 56 is patterned according to the configuration of the first layer of the conductive tracing layout so that the dielectric layer 56 is removed except the portion directly overlying the first conductive layer 52. Subsequently, a second conductive layer 58 and a second photo-resist layer 60 are formed on the conductive substrate 50, and the second photo-resist layer 60 is patterned and removed partially, as shown in FIG. 3D. Then, the unmasked portions of the conductive layer 58 are etched off and the residual photo-resist mask 60 is removed, as shown in FIG. 3E. Accordingly, a second layer of conductive tracing layout is defined above the first layer of conductive tracing layout with a dielectric material interfacing between the first and the second layers.

In the above preferred embodiments illustrated above, the conductive substrate 40, 50, for example, is a substrate coated with an ITO (Indium Tin Oxide) film or an ITO glass. The ITO-film coated substrate can be obtained by coating an ITO conductive film on a PET (polyethylene terephthalate) substrate. On the other hand, the ITO glass can be made by coating an ITO conductive film on a glass substrate. The first conductive layer 42 or 52 and the second conductive layer 58, for example, are made of silver and are formed by a Physical Vapor Deposition (PVD) process or Chemical Vapor Deposition (CVD) process, and removed by etching procedures. The preferred thickness of the conductive layer is preferably 3000~5000 angstroms. The dielectric layer 56 is, for example, made of oxide or nitride and is formed by a Physical Vapor Deposition (PVD) process or Chemical Vapor Deposition (CVD) process. The preferred thickness of the dielectric layer is preferably 1000~10000 angstroms. The first photo-resist layer 44 or 54 and the second photo-resistilayer 60 are patterned and removed by using a photolithographic technology.

According to the above-mentioned steps, a tri-layer or multi-layer conductive tracing layoutcan be formed on the conductive substrate. For example, the third conductive tracing layout could be formed on the second conductive tracing layout with another dielectric layer interfaced therebetween.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for implementing a conductive tracing layout in a touch panel, comprising steps of:

providing two conductive substrates of said touch panel;

forming a first conductive layer on at least one of said conductive substrates;

forming a first photo-resist layer on said first conductive layer;

removing a specified portion of said first photo-resist layer to form a first specified mask on a specified portion of said first conductive layer;

removing said first conductive layer except said specified portion of said first conductive layer to form a first conductive tracing layout; and arranging said two conductive substrates in parallel and securing said two conductive substrates to each other with a gap existing between said two conductive substrates.

2. The process according to claim 1 wherein said conductive substrate is coated with an ITO material, and said first conductive layer is made of silver.

3. The process according to claim 1 wherein said gap between said two conductive substrates is provided by providing non-conductive spacer dots between said conductive substrates.

4. The process according to claim 1 further comprising a step of removing the residual portion of said first photo-resist layer.

5. The process according to claim 1 further comprising:

forming a dielectric layer on said first conductive tracing layout;

removing a specified portion of said dielectric layer according to said first conductive tracing layout;

forming a second conductive layer over said dielectric layer;

forming a second photo-resist layer on said second conductive layer;

removing a specified portion of said second photo-resist layer to form a second specified mask on said second conductive layer; and removing said second conductive layer except said specified portion of said second conductive layer to form a second conductive tracing layout.

6. The process according to claim 5 further comprising a step of removing the residual portion of said second photo-resist layer.

* * * * *